(12) United States Patent
Suzuki et al.

(10) Patent No.: US 6,456,361 B1
(45) Date of Patent: Sep. 24, 2002

(54) METHOD AND INSTRUMENT FOR MEASURING VACUUM ULTRAVIOLET LIGHT BEAM, METHOD OF PRODUCING DEVICE AND OPTICAL EXPOSURE APPARATUS

(75) Inventors: Toru Suzuki, Hiratsuka (JP); Osamu Wakabayashi, Hiratsuka (JP)

(73) Assignee: Komatsu Ltd., Tokyo (JP)

( * ) Notice: Subject to any disclaimer, the term of this patent is extended or adjusted under 35 U.S.C. 154(b) by 0 days.

(21) Appl. No.: 09/808,049

(22) Filed: Mar. 15, 2001

(30) Foreign Application Priority Data

Mar. 24, 2000 (JP) .......................... 2000-083106

(51) Int. Cl.[7] .................. G03B 27/42; G03B 27/72
(52) U.S. Cl. ................... 355/53; 355/69; 355/71
(58) Field of Search ............... 355/53, 55, 52; 250/492.2, 492.22, 205, 548; 356/399–401

(56) References Cited

FOREIGN PATENT DOCUMENTS

JP 408233650 A * 9/1996
JP 411183254 A * 7/1999

OTHER PUBLICATIONS

Hosono, Hideo et al., "Effects of Fluorine Dimer Excimer Laser Radiation on the Optical Transmission and Defect Formation of Various Types of Synthetic $SiO_2$ Glasses." vol. 74, No. 19, May 10, 1999.

* cited by examiner

Primary Examiner—Russell Adams
Assistant Examiner—Hung Henry Nguyen
(74) Attorney, Agent, or Firm—Stevens, Davis, Miller & Mosher, LLP

(57) ABSTRACT

A method and instrument for measuring a vacuum ultraviolet light beam in which a position of an optical unit used for measuring a vacuum ultraviolet light beam can be adjusted easily and measurement of the vacuum ultraviolet light beam is carried out quickly. This method includes a first step of passing a ArSHG laser beam through an achromatic lens system; a second step of adjusting a position of the achromatic lens system such that the ArSHG laser beam which passed through the achromatic lens system is focused on a CCD sensor; a third step of purging the inside of a purge box by using nitrogen gas; and a fourth step of focusing an $F_2$ laser beam which passed through the achromatic lens system on the CCD sensor so as to measure the $F_2$ laser beam.

2 Claims, 4 Drawing Sheets

METHOD AND INSTRUMENT FOR MEASURING VACUUM ULTRAVIOLET LIGHT BEAM, METHOD OF PRODUCING DEVICE AND OPTICAL EXPOSURE APPARATUS

BACKGROUND OF THE INVENTION

1. Field of the Invention

The present invention relates to a method and an instrument for measuring a vacuum ultraviolet light beam having a wavelength not longer than 190 nm. Further, the present invention relates to a method for producing a device which method includes exposure treatment using the vacuum ultraviolet light beam and an optical exposure apparatus.

2. Description of a Related Art

In an optical exposure apparatus, a micro-fabrication of a pattern to be transcribed on photo resist, which is coated on a predetermined portion of a substrate, is going on more than ever before, and more improvement of resolution of an optical exposure apparatus is demanded. As a solution for responding to this demand, it is promoted to shorten a wavelength of a light beam for exposure treatment. At the present time, the usable light source that can output a light beam having the shortest wavelength is an $F_2$ (molecular fluorine) laser. The $F_2$ laser beam is a sort of vacuum ultraviolet light beam having a wavelength not longer than 190 nm. And an oscillated wavelength of the $F_2$ laser beam is 157.63 nm, and an oscillated spectral width of the $F_2$ laser beam is not longer than a few pico-meters.

From the above reason, in recent years, an optical exposure apparatus using the $F_2$ laser, which will be called as an $F_2$ laser beam exposure system hereinafter, as a light source for exposure is provided. Also, an instrument for measuring the $F_2$ laser beam, which will be called as an $F_2$ laser beam measuring instrument hereinafter, is provided. An optical unit of each of those instruments includes a fluoride lens. The fluoride lens is a single lens composed from fluorite ($CaF_2$), which is suited for the $F_2$ laser beam. The $F_2$ laser beam tends to be easily absorbed into oxygen. On this account, while the $F_2$ laser beam is transmitted, an inside of a housing enclosing a light detector, an optical unit and so on is evacuated or purged by using nitrogen gas. Nitrogen purge is an operation of removing oxygen gas by using dry nitrogen gas.

By the way, an instrument for measuring a light beam or an optical exposure apparatus should be adjusted such that an optical unit included in the instrument realizes its own aim. This is the same in a conventional $F_2$ laser beam measuring instrument or a conventional $F_2$ laser beam exposure system. However, a focal length of a single lens such as a fluoride lens is different in accordance with a wavelength of a light beam. For example, in the case of a convex fluoride lens having a curvature radius of 90 mm and a diameter of 50 mm, the focal length for a light beam radiated from a low pressure mercury-vapor lamp and having a mercury resonance line (253.65 nm) is 253.65 mm, while the focal length for an $F_2$ laser beam having a wavelength of 157.63 nm is 214.60 mm. On this account, in the conventional $F_2$ laser beam measuring instrument or the conventional $F_2$ laser beam exposure system, other light source except for the $F_2$ laser can not be used for adjustment of an optical unit, for example, adjustment of a position of the fluoride lens.

Therefore, adjustment of the conventional $F_2$ laser beam measuring instrument or the conventional $F_2$ laser beam exposure system is carried out as follows:

(1) The inside of the housing enclosing a light detector, an optical unit and so on is evacuated or purged by using nitrogen gas.

(2) An $F_2$ laser beam is transmitted into the inside of the housing which has been evacuated or purged by using nitrogen gas. And the $F_2$ laser beam is focused on the light detector through the optical unit.

(3) Based upon the result obtained by the $F_2$ laser beam focused on the light detector, adjustment of the optical unit including adjustment of a position of the fluoride lens is carried out.

Thus, the adjustment of the optical unit including the adjustment of the position of the fluoride lens must be carried out in the housing which has been evacuated or purged by using nitrogen gas. Therefore, operation of the adjustment is very difficult. This increases difficulty of measurement of the $F_2$ laser beam and prevents the spread of exposure treatment using the $F_2$ laser beam.

In order to solve such a problem, it is proposed that an achromatic lens system designed optimally so as to fulfill achromatic conditions for both an $F_2$ laser beam and another light beam (for example, a mercury resonance line) is substituted for the fluoride lens. In order to produce such an achromatic lens system, at least two materials of glass are required which are different in a dispersion value of a refractive index. However, in the past, fluorite was the only material of glass suited for the $F_2$ laser beam, and therefore, such an achromatic lens system could not be produced.

SUMMARY OF THE INVENTION

The present invention has been accomplished in view of those problems. The first object of the present invention is to provide a method and an instrument for measuring a vacuum ultraviolet light beam wherein a position of an optical unit to be used for measuring the vacuum ultraviolet light beam can be easily adjusted so as to quickly measure the vacuum ultraviolet light beam. Further, the second object of the present invention is to provide a method of producing a device and an optical exposure apparatus wherein a position of each of an illumination optical unit and a projection optical unit to be used for exposure treatment by using a vacuum ultraviolet light beam can be easily adjusted so as to quickly carry out the exposure treatment.

In order to solve the above-mentioned problem, a method of measuring a vacuum ultraviolet light beam having a wavelength not longer than 190 nm, according to the present invention, comprises: a first step of passing a regular light beam having a wavelength longer than 190 nm through an optical unit; a second step of adjusting a position of an achromatic lens system included in the optical unit such that the regular light beam which passed through the optical unit is focused on a light detector, the achromatic lens system being composed by combining one single lens produced from fluorite with another single lens produced from fluorine-doped synthetic quartz so as to fulfill achromatic conditions for both the regular light beam and the vacuum ultraviolet light beam; a third step of conducting, after the second step, one of (i) evacuating the inside of a housing for enclosing the optical unit and the light detector and (ii) purging the inside of the housing by using nitrogen gas; and a fourth step of focusing, after the third step, the vacuum ultraviolet light beam which passed through the optical unit on the light detector so as to measure the vacuum ultraviolet light beam.

Further, an instrument for measuring a vacuum ultraviolet light beam having a wavelength not longer than 190 nm, according to the present invention, comprises: a light detector for detecting both a regular light beam having a wavelength longer than 190 nm and the vacuum ultraviolet light beam; an optical unit including an achromatic lens system which is composed by combining one single lens produced from fluorite with another single lens produced from fluorine-doped synthetic quartz so as to fulfill achromatic conditions for both the regular light beam and the vacuum ultraviolet light beam; and a housing for enclosing the optical unit and the light detector in order to conduct one of (i) evacuating the inside of the housing and (ii) purging the inside of the housing by using nitrogen gas when measuring the vacuum ultraviolet light beam.

Furthermore, a method of producing a device by using an illumination optical unit, a photo mask stage for fixing a photo mask in which a desired pattern is formed, a projection optical unit and a substrate stage for fixing a substrate in which a predetermined portion is coated with photo resist each enclosed in a housing, according to the present invention, comprises: a first step of passing a regular light beam having a wavelength longer than 190 nm through the illumination optical unit, the photo mask and the projection optical unit in this order; a second step of adjusting a position of an achromatic lens system included in each of the illumination optical unit and the projection optical unit such that the regular light beam which passed through the illumination optical unit, the photo mask and the projection optical unit in this order is focused on the photo resist, the achromatic lens system being composed by combining one single lens produced from fluorite with another single lens produced from fluorine-doped synthetic quartz so as to fulfill achromatic conditions for both the regular light beam and the vacuum ultraviolet light beam; a third step of evacuating the inside of the housing after the second step; and a fourth step of focusing, after the third step, the vacuum ultraviolet light beam which passed through the illumination optical unit, the photo mask and the projection optical unit in this order on the photo resist in order to expose the photo resist.

Moreover, an optical exposure apparatus according to the present invention comprises: an illumination optical unit including an achromatic lens system which is composed by combining one single lens produced from fluorite with another single lens produced from fluorine-doped synthetic quartz so as to fulfill achromatic conditions for both a regular light beam having a wavelength longer than 190 nm and a vacuum ultraviolet light beam having a wavelength not longer than 190 nm; a photo mask stage, arranged on an output side of the illumination optical unit, for fixing a photo mask in which a desired pattern is formed; an projection optical unit arranged on an output side of the photo mask stage, the projection optical unit including an achromatic lens system which is composed by combining one single lens produced from fluorite with another single lens produced from fluorine-doped synthetic quartz so as to fulfill achromatic conditions for both the regular light beam and the vacuum ultraviolet light beam; a substrate stage, arranged on an output side of the projection optical unit, for fixing a substrate in which a predetermined portion is coated with photo resist; and a housing for enclosing the illumination optical unit, the photo mask stage, the projection optical unit and the substrate stage in order to evacuate the inside of the housing when exposing the photo resist by using the vacuum ultraviolet light beam.

According to the present invention, the position of the achromatic lens system included in the optical unit is adjusted such that the regular light beam which passed through the optical unit is focused on the light detector. The wavelength of the regular light beam is longer than 190 nm and different from that of the vacuum ultraviolet light beam, and therefore, the regular light beam is hard to be absorbed in oxygen and can be transmitted in the air. Accordingly, operation of adjusting the position of the achromatic lens system can be carried out easily in the air. When the vacuum ultraviolet light beam is to be measured, the inside of the housing is evacuated or purged by using nitrogen gas. Since the achromatic lens system has been already adjusted in the predetermined position, the measurement of the vacuum ultraviolet light beam can be carried out quickly.

BRIEF DESCRIPTION OF THE DRAWINGS

The present invention will be described in more detail in conjunction with the appended drawings, wherein.

DESCRIPTION OF THE PREFERRED EMBODIMENTS

Figure 1:
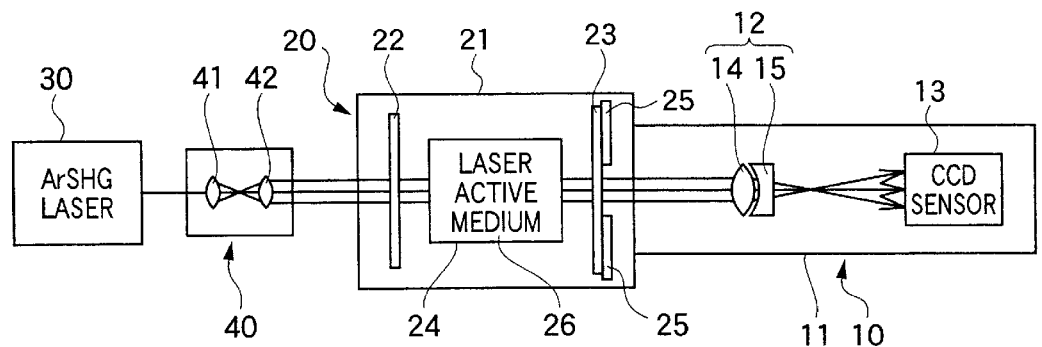
FIG. 1 is a schematic diagram showing general constitution of an instrument for measuring a vacuum ultraviolet light beam according to the first embodiment of the present invention.

Referring to attached drawings, embodiments of the present invention will be explained as follows. In the embodiments, since the same reference numeral is used for the common element, the explanation of the common element will be omitted.

Figure 2:
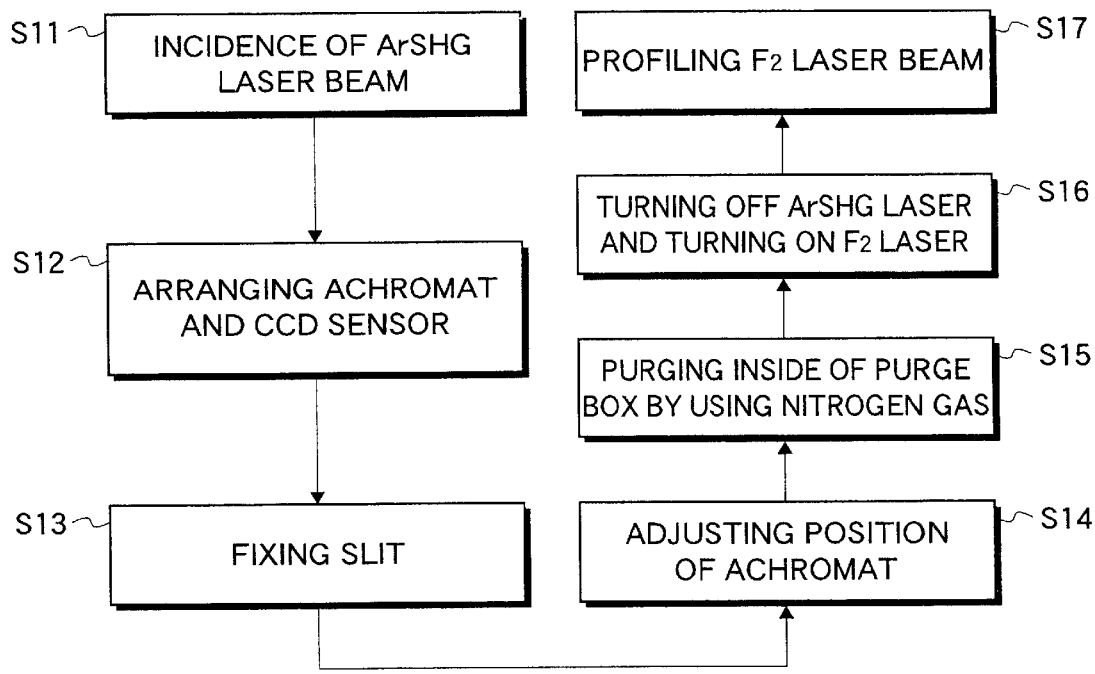
FIG. 2 is a flowchart showing a measuring process using the instrument as shown in FIG. 1.

At first, referring to FIGS. 1 and 2, the first embodiment of the present invention will be explained. FIG. 1 shows general constitution of an instrument for measuring a vacuum ultraviolet light beam according to the first embodiment of the present invention. This instrument is used for measuring, for example, beam-profiling a diffraction pattern of an $F_2$ (molecular fluorine) laser beam radiated from $F_2$ laser 20. Therefore, this instrument will be called as a beam-profiler instrument hereinafter.

As shown in FIG. 1, beam-profiler instrument 10 includes achromatic lens system 12 and CCD sensor 13 which are arranged in purge box 11.

Achromatic lens system or achromat includes two or more lenses so as to correct chromatic aberration for selected two wavelengths. Achromatic lens system 12 is composed by combining single lens 14, which is produced from fluorite ($CaF_2$) and has a convex form, with single lens 15 which is produced from fluorine-doped synthetic quartz and has a planoconcave form. The fluorine-doped synthetic quartz is a material of glass that has been developed for a light beam having a wavelength range including 157 nm. The fluorine-doped synthetic quartz is explained in "Effects of fluorine dimer excimer laser radiation on the optical transmission and defect formation of various types of synthetic $SiO_2$ glasses" Hosono et. al., Applied Physics Letters Vol. 74 No. 19, May 10, 1999 and so forth in detail.

Fluorite and fluorine-doped synthetic quartz are materials of glass which are different in a dispersion value of a refractive index. On this account, in this embodiment, a form and numerical values of each of single lenses 14 and 15 are designed optimally so as to fulfill achromatic conditions for both an ArSHG laser beam (second harmonic generation argon ion laser beam) having a wavelength of 248.25 nm and an $F_2$ laser beam having a wavelength of 157.63 nm. By using achromatic lens system 12, the ArSHG laser beam and the $F_2$ laser beam can be focused on the same position. Since a wavelength of the ArSHG laser beam is longer than 190 nm, that is, the ArSHG laser beam does not belong to the vacuum ultraviolet light beam, the ArSHG laser beam is hard to be absorbed in oxygen and can be transmitted in the air.

CCD sensor 13 is a sort of optical sensors and has plural light detectors, for example, photodiodes arranged in one-dimensional or two-dimensional. Each light detector of CCD sensor 13 outputs an electric signal corresponding to intensity of a detected light beam. In this embodiment, CCD sensor 13 is used for detecting a diffraction pattern of an $F_2$ laser beam.

$F_2$ laser 20 is a light source which generates an $F_2$ laser beam. $F_2$ laser 20 includes rear mirror 22, front mirror 23 and medium chamber 24 as central parts, which are enclosed in vacuum chamber 21.

In this embodiment, a beam diameter of an ArSHG laser beam radiated from ArSHG laser 30 is expanded by beam expander 40 before the ArSHG laser beam is incident into $F_2$ laser 20. Beam expander 40 includes two convex single lenses 41 and 42.

Rear mirror 22 is designed so as to transmit the ArSHG laser beam and totally reflect the $F_2$ laser beam. On the other hand, front mirror 23 is designed so as to transmit the ArSHG laser beam and partially reflect the $F_2$ laser beam. Slit board 25 is set on an output side of front mirror 23 before measurement of a diffraction pattern of the $F_2$ laser beam. The ArSHG laser beam or the $F_2$ laser beam that passed through front mirror 23 is diffracted by slit board 25 and incident into purge box 11.

Therefore, in the case where the inside of purge box 11 is not purged, the ArSHG laser beam reaches CCD sensor 13 through achromatic lens system 12, while the $F_2$ laser beam is absorbed in oxygen included in purge box 11. On the other hand, in the case where the inside of purge box 11 is purged by using nitrogen gas, both the ArSHG laser beam and the $F_2$ laser beam can reach CCD sensor 13 through achromatic lens system 12.

A distance between rear mirror 22 and front mirror 23 is determined to be integral times as long as a half of the wavelength of the $F_2$ laser beam. Accordingly, Fabry-Perot resonator is formed between rear mirror 22 and front mirror 23. By this resonance structure, it is possible to generate a standing wave of the $F_2$ laser beam between rear mirror 22 and front mirror 23.

In medium chamber 24, many pulses of the $F_2$ laser beam are induced by electric discharge and emitted from laser active medium 26, for example, compound gas of $F_2$ and He. Therefore, when the inside of vacuum chamber 21 is evacuated, the pulses of the $F_2$ laser beam are amplified whenever they pass through laser active medium 26.

Next, referring to FIG. 2, a measuring process by using beam-profiler instrument 10 will be explained. FIG. 2 is a flowchart showing the measuring process.

At first, at step S11, ArSHG laser 30 is set up and emits an ArSHG laser beam. The ArSHG laser beam emitted from ArSHG laser 30 is incident into $F_2$ laser 20.

Next, at step S12, achromatic lens system 21 and CCD sensor 13 are arranged in purge box 11. A position of achromatic lens system 12 is determined properly. At this time point, air fills purge box 11.

Further, at step S13, slit board 25 is set on an output side of front mirror 23. Therefore, the ArSHG laser beam or the $F_2$ laser beam that passed through front mirror 23 is diffracted by slit board 25 and incident into purge box 11. At this time point, the ArSHG laser beam reaches CCD sensor 13 through achromatic lens system 12.

Further, at step S14, the position of achromatic lens system 12 is adjusted such that the ArSHG laser beam which passed through achromatic lens system 12 is focused on CCD sensor 13.

Next, at step S15, the inside of purge box 11 is purged by using nitrogen gas. Then, at step S16, ArSHG laser 30 is turned off and $F_2$ laser 20 is turned on. As a result, the $F_2$ laser beam is focused on CCD sensor 13 through achromatic lens system 12. At step S17, a profile of the diffraction pattern of the $F_2$ laser beams can be measured by analyzing output signals of CCD sensor 13.

According to this embodiment, a position of achromatic lens system 12 is adjusted such that the ArSHG laser beam which passed through achromatic lens system 12 is focused on CCD sensor 13. A wavelength of the ArSHG laser beam is longer than 190 nm and different from that of the $F_2$ laser beam. Therefore, the ArSHG laser beam is hard to be absorbed in oxygen and can be transmitted in the air. On this account, operation of adjusting a position of achromatic lens system 12 can be easily carried out in the air. Since the position of achromatic lens system 12 has been already adjusted when the inside of purge box is purged by using nitrogen gas, measurement of the $F_2$ laser beam can be quickly carried out.

Figure 3:
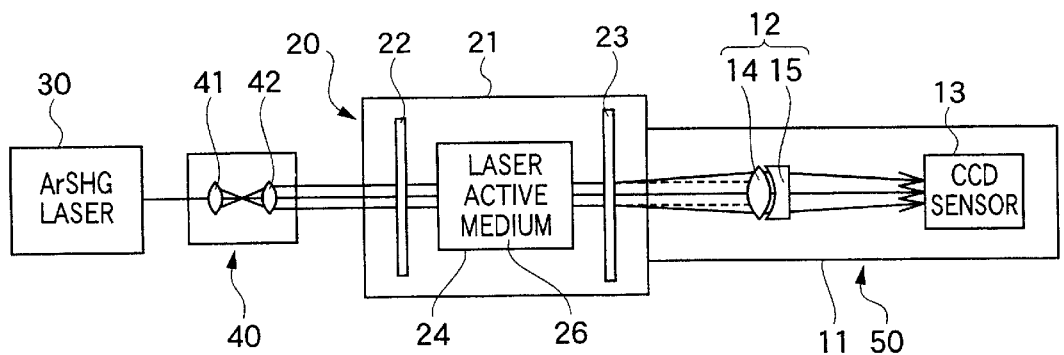
FIG. 3 is a schematic diagram showing general constitution of an instrument for measuring a vacuum ultraviolet light beam according to the second embodiment of the present invention.

Next, referring to FIG. 3, the second embodiment of the present invention will be explained. FIG. 3 shows general constitution of an instrument for measuring a vacuum ultraviolet light beam according to the second embodiment of the present invention. Since this instrument is used for measuring a beam divergence angle of an $F_2$ laser beam, this instrument will be called as a beam divergence instrument hereinafter.

A general laser beam is focused not on a point but on a circular area because it diverges from a parallel light beam by a minute angle. In this view, according to this embodiment, a beam divergence angle of an $F_2$ laser beam radiated from $F_2$ laser 20 is measured by analyzing a circular image formed on CCD sensor by the $F_2$ laser beam.

Beam divergence instrument 50 has the same constitution as that of the instrument as shown in FIG. 1 except that slit board 25 is not arranged on front mirror 23. On this account, a position of achromatic lens system 12 is adjusted by the same operation as step S14 in the first embodiment.

Therefore, according to this embodiment, it is possible to obtain the same effect as that in the first embodiment.

Figure 4A:
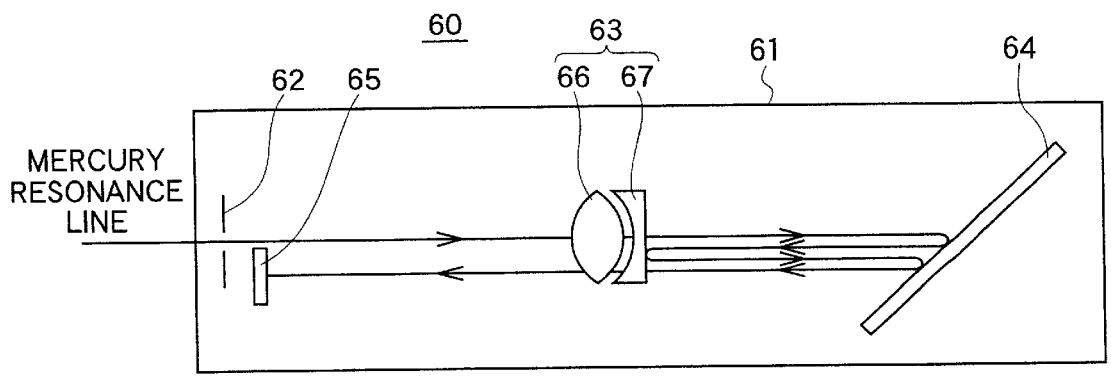
FIG. 4A is a schematic diagram showing a state of an instrument for measuring a vacuum ultraviolet light beam according to the third embodiment of the present invention before adjustment.
Figure 4B:
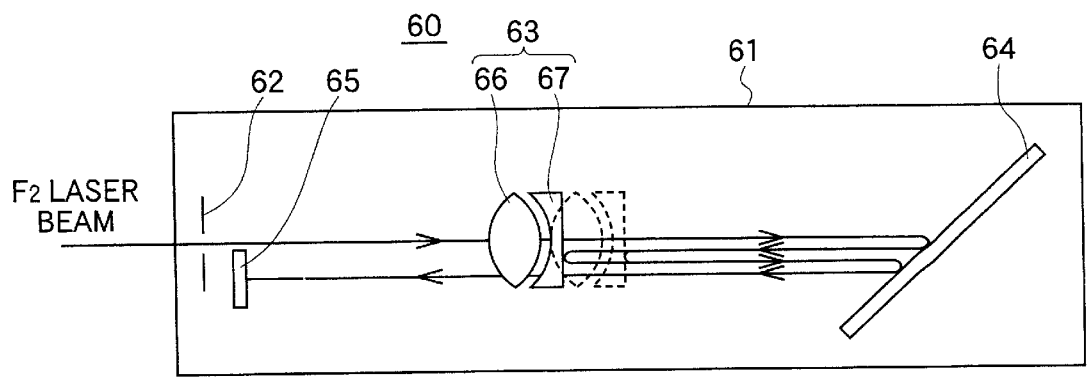
FIG. 4B is a schematic diagram showing a state of the measuring instrument according to the third embodiment of the present invention after adjustment.
Figure 5:
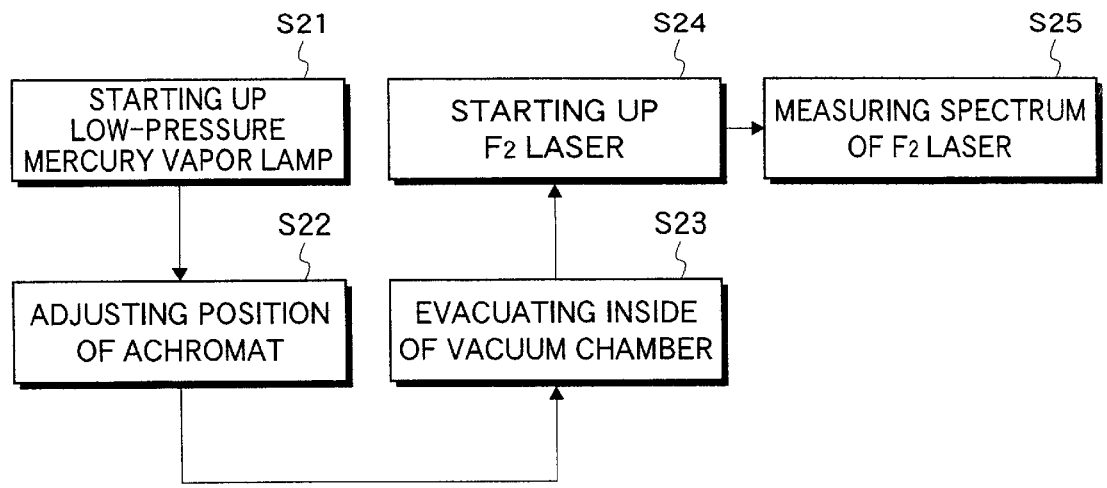
FIG. 5 is a flowchart of a measuring process using the measuring instrument as shown in FIGS. 4A and 4B.

Next, referring to FIGS. 4A, 4B and 5, the third embodiment of the present invention will be explained. FIG. 4A shows a state of an instrument for measuring a vacuum ultraviolet light beam according to this embodiment before adjustment. FIG. 4B shows a state of the instrument after adjustment. Since this instrument is used for measuring a spectrum of the $F_2$ laser beam by spectrum-separating the $F_2$ laser beam, this instrument will be called as a spectrometer hereinafter.

As shown in FIGS. 4A and 4B, spectrometer 60 includes slit board 62, achromatic lens system 63, diffraction grating 64 and line sensor 65 as central parts enclosed in vacuum chamber 61.

Slit board 62 is a sort of optical elements for diffusing an incident light beam in a predetermined angular range. Slit board 62 is arranged perpendicularly against an optical axis of achromatic lens system 63. A light beam that passed through slit board 62 is transmitted along the optical axis of achromatic lens system 63.

Achromatic lens system 63 is composed by combining single lens 66, which is produced from fluorite and has a convex form, with single lens 67 which is produced from fluorine-doped synthetic quartz and has a planoconcave form. In this embodiment, a form and numerical values of each of single lenses 66 and 67 are designed optimally so as to fulfill achromatic conditions for both a light beam having a mercury resonance line (253.65 nm) and an $F_2$ laser beam having a wavelength of 157.63 nm. By using achromatic lens system 63, the light beam having the mercury resonance line and the $F_2$ laser beam can be focused on the same position. Since the mercury resonance line is longer than 190 nm, the light beam having the mercury resonance line does not belong to the vacuum ultraviolet light beam, and therefore, it is hard to be absorbed in oxygen and can be transmitted in the air.

Diffraction grating 64 is arranged such that it is rotated slightly from the Littrow arrangement in which an incident angle is the same as an output angle. By using diffraction grating 64, a light beam incident from achromatic lens system 63 can be diffracted into a direction rotated by a slight angle from the incident direction of the light beam. Such a large diffraction angle as shown in FIGS. 4A and 4B is realized by, for example, an Echelle grating.

Line sensor 65 is an optical element that is composed by using one-dimensional image sensors, a photo diode array or the like. In detail, line sensor 65 has plural channels arranged in one-dimension. Each channel of line sensor 65 outputs a response signal corresponding to intensity of a received light beam. Furthermore, such channels may be arranged in two-dimension so that outputs of channels in plural rows are added together for each column. Line sensor 65 is arranged to receive a light beam which has gone and returned twice between achromatic lens system 63 and diffraction grating 64.

Next, referring to FIG. 5, a measuring process using spectrometer 60 will be explained. FIG. 5 is a flowchart showing the measuring process.

First, at step S21, a low-pressure mercury vapor lamp is fixed on vacuum chamber 61 and then set up. Thus, a light beam having a mercury resonance line radiated from the low-pressure mercury vapor lamp is incident into vacuum chamber 61.

Next, at step S22, achromatic lens system 63 is shifted from one position indicated by a broken line to another position indicated by a solid line in FIG. 4B such that the light beam having the mercury resonance line that passed through achromatic lens system 63 is focused on line sensor 65.

In this state, a part of the light beam having the mercury resonance line incident into vacuum chamber 61 passes through achromatic lens system 63, while the rest is reflected from achromatic lens system 63 to slit board 61. The light beam that passed through achromatic lens system 63 is diffracted by diffraction grating 64 to achromatic lens system 63. A part of the diffracted light beam passes through achromatic lens system 63, while the rest is reflected from achromatic lens system 63 to diffraction grating 64. The light beam incident into diffraction grating 64 again is diffracted toward achromatic lens system 63 one more time, and a part of the diffracted light beam reaches line sensor 65 through achromatic lens system 63.

Next, at step S23, the inside of vacuum chamber 61 is evacuated. Further, at step S24, the low-pressure mercury vapor lamp is replaced with the $F_2$ laser, and then, the $F_2$ laser is set up. By this operation, the $F_2$ laser beam is incident into vacuum chamber 61 and passes along the same optical path as that of the light beam having the mercury resonance line to be focused on line sensor 65.

Furthermore, at step S25, a spectrum of the $F_2$ laser beam is measured by analyzing the output signals of line sensor 65.

According to this embodiment, a position of achromatic lens system 63 is adjusted such that a mercury resonance light beam, which has gone and returned twice between achromatic lens system 63 and diffraction grating 64, is focused on line sensor 65 through achromatic lens system 63. Since the wavelength of the mercury resonance light beam is longer than 190 nm and different from that of the $F_2$ laser beam, the mercury resonance light beam is hard to be absorbed in oxygen. Further, the low-pressure mercury vapor lamp is inexpensive and radiates the mercury resonance line with stability. Accordingly, operation of adjusting the position of achromatic lens system 63 can be easily carried out in the air. Since the position of achromatic lens system 63 has been already adjusted when the inside of vacuum chamber 61 is evacuated, the measurement of the $F_2$ laser beam can be quickly carried out.

Figure 6A:
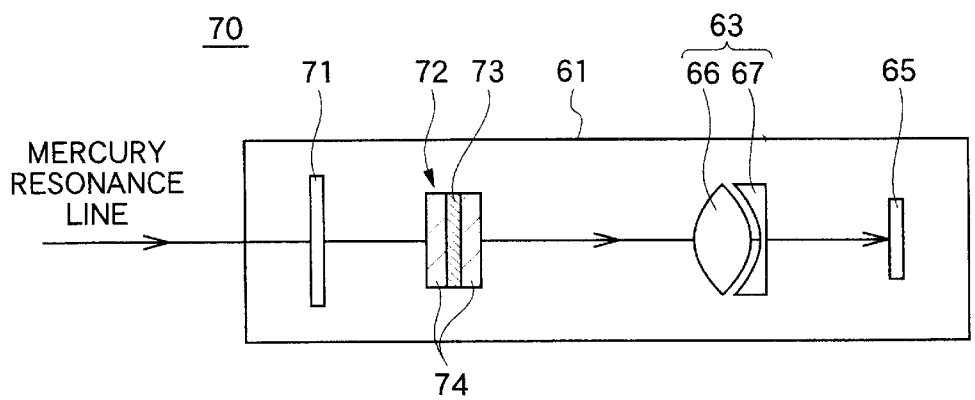
FIG. 6A is a schematic diagram showing a state of an instrument for measuring a vacuum ultraviolet light according to the fourth embodiment of the present invention before adjustment.
Figure 6B:
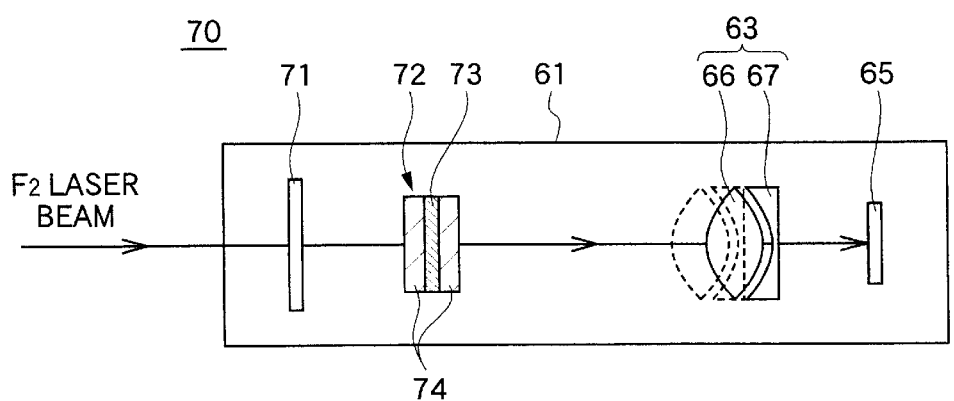
FIG. 6B is a schematic diagram showing a state of the measuring instrument according to the fourth embodiment of the present invention after adjustment.

Next, referring to FIGS. 6A and 6B, the fourth embodiment of the present invention will be explained. FIG. 6A shows a state of an instrument for measuring a vacuum ultraviolet light beam according to this embodiment before adjustment. FIG. 6B shows a state of the instrument after adjustment. Since this instrument is used for measuring a spectrum of an $F_2$ laser beam by spectrum-separating the $F_2$ laser beam, this instrument will be called as a spectrometer hereinafter.

As shown in FIG. 6, spectrometer 70 includes ground glass 71, etalon 72, achromatic lens system 63 and line sensor 65 enclosed in vacuum chamber 61.

Ground glass 71 is a sort of optical element for scattering an incident light beam into various directions, and is arranged perpendicularly against an optical axis of achromatic lens system 63. A light beam which passed through ground glass 71 is transmitted along the optical axis of achromatic lens system 63.

Etalon 72 is composed by forming partial reflection coating 74 on both sides of optical glass 73 which is produced from, for example, fluorite ($CaF_2$) to have a flat form. Fabry-Perot resonator is formed between the two partial reflection coatings. Owing to this resonance structure, interference fringes of the F₂ laser beam having are formed as rings on line sensor 65 when the position of achromatic lens system 63 has been adjusted.

Since spectrometer 70 includes achromatic lens system 63 for the light beam having the mercury resonance line and the F₂ laser beam similarly to the third embodiment, the position of achromatic lens system 63 can be adjusted by carrying out by the same operation as step S22 in the third embodiment. Accordingly, the same effect as that in the third embodiment can be obtained in this embodiment.

Figure 7:
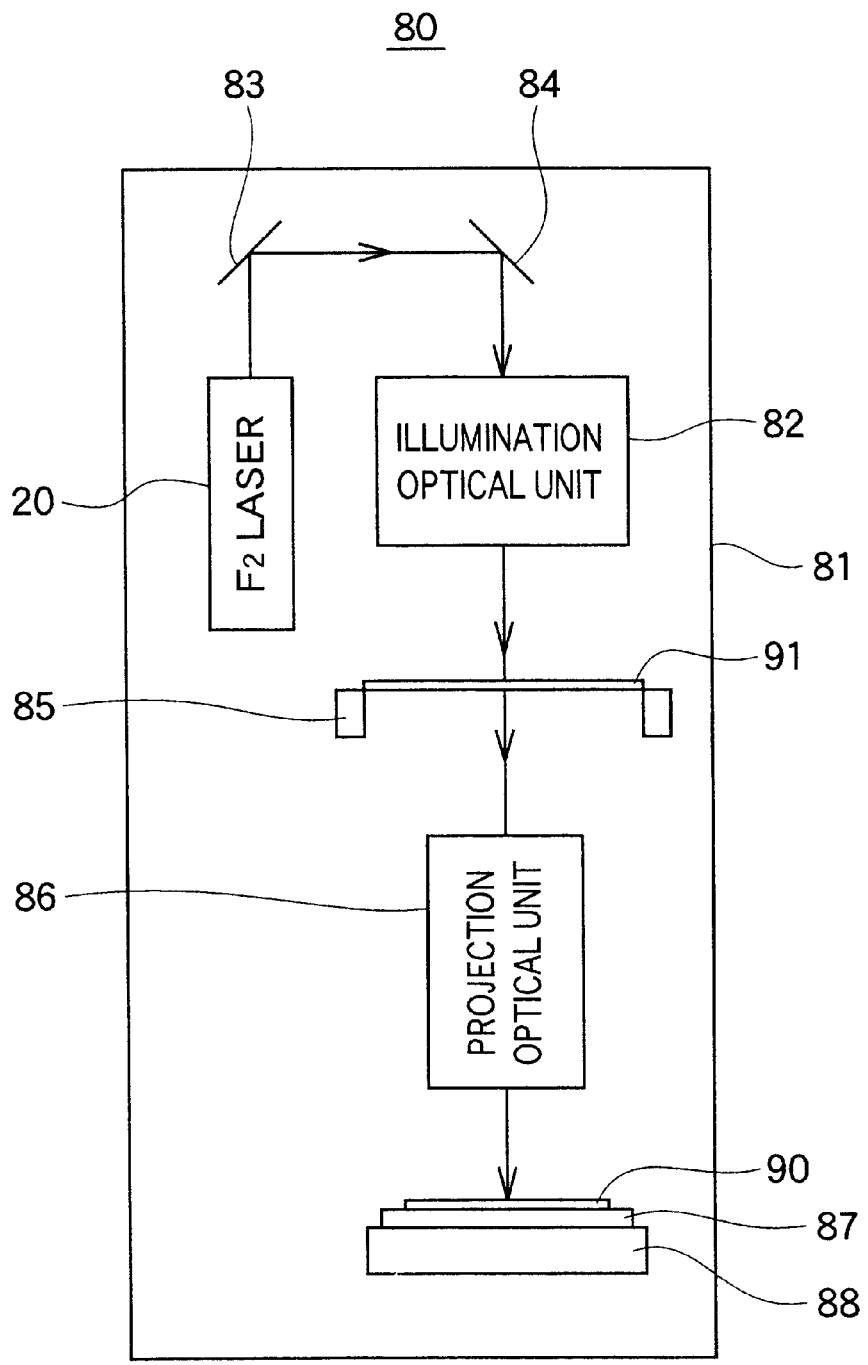
FIG. 7 is a schematic diagram showing general constitution of an optical exposure apparatus according to an embodiment of the present invention.

Next, referring to FIG. 7, an optical exposure apparatus according to an embodiment of the present invention will be explained. FIG. 7 shows general constitution of the optical exposure apparatus according this embodiment.

Optical exposure apparatus 80 as shown in FIG. 7 is an apparatus for exposing photo resist coated on a predetermined portion of wafer 90 by using the F₂ laser beam. Main components of the optical exposure apparatus 80 are enclosed in vacuum chamber 81. In chamber 81, F₂ laser 20 generates and radiates the F₂ laser beam by using an ArSHG laser beam incident from an ArSHG laser.

Illumination optical unit 82 including an achromatic lens system having the same constitution as that in the first embodiment is arranged on an output side of F₂ laser 20. The F₂ laser beam which passed through mirrors 83 and 84 illuminates photo mask 91 through illumination optical unit 82.

Mask stage 85 is arranged on an output side of illumination optical unit 82 and used to fix photo mask 91 in which a desired pattern is formed. The F₂ laser beam that passed through photo mask 91 is incident into projection optical unit 86 arranged on an output side of mask stage 85. Projection optical unit 86 includes an achromatic lens system having the same constitution as that in the first embodiment. Projection optical unit 86 projects the F₂ laser beam that passed through photo mask 91 on the photo resist coated on wafer 90.

Wafer stage 88 is arranged on an output side of projection optical unit 86 and used to fix chuck 87 for absorbing and retaining wafer 90. The F₂ laser beam that passed through photo mask 91 is projected on the photo resist coated on wafer 90 and exposes the photo resist while mask stage 85 and wafer stage 88 are scanned synchronously to the opposite directions. As a result, a pattern in photo mask 91 is transcribed on the photo resist.

In this embodiment, each of illumination optical unit 82 and projection optical unit 86 includes an achromatic lens system having the same constitution as in the first embodiment. A position of each achromatic lens system is adjusted such that the ArSHG laser beam that passed through photo mask 91 is focused on the photo resist coated on wafer 91. Thus, operation of adjusting the position of each achromatic lens system can be easily carried out in the air. Since the position of each achromatic lens system has been already adjusted when the inside of vacuum chamber 81 is evacuated, the exposure treatment by using the F₂ laser beam can be quickly carried out.

In the above-mentioned embodiments, an achromatic lens system that fulfils achromatic conditions for both a KrF (kripton fluoride) excimer laser beam having a wavelength of 248 nm and the F₂ laser beam may be used. Further, an achromatic lens system that fulfils achromatic conditions for both an ArF (argon fluoride) excimer laser beam having a wavelength of 198 nm and the F₂ laser beam may be used. Furthermore, an achromatic lens system including a plurality of lenses except for a combination of a convex lens and a concave lens may be used.

As explained above, according to the present invention, adjustment of a position of an achromatic lens system included in an optical unit can be easily carried out in the air. When a vacuum ultraviolet light beam is to be measured, the inside of the housing is evacuated or purged by using nitrogen gas. Since the achromatic lens system has been already adjusted in the predetermined position, the measurement of the vacuum ultraviolet light beam can be carried out quickly. Similarly, exposure treatment by using the vacuum ultraviolet light beam can be carried out quickly.

What is claimed is:

1. A method of measuring a vacuum ultraviolet light beam having a wavelength not longer than 190 nm, said method comprising:

a first step of passing a regular light beam having a wavelength longer than 190 nm through an optical unit;

a second step of adjusting a position of an achromatic lens system included in said optical unit such that the regular light beam which passed through said optical unit is focused on a light detector, said achromatic lens system being composed by combining one single lens produced from fluorite with another single lens produced from fluorine-doped synthetic quartz so as to fulfill achromatic conditions for both the regular light beam and the vacuum ultraviolet light beam;

a third step of conducting, after the second step, one of (i) evacuating the inside of a housing for enclosing said optical unit and said light detector and (ii) purging the inside of said housing by using nitrogen gas; and a fourth step of focusing, after the third step, the vacuum ultraviolet light beam which passed through said optical unit on said light detector so as to measure the vacuum ultraviolet light beam.

2. An instrument for measuring a vacuum ultraviolet light beam having a wavelength not longer than 190 nm, said instrument comprising:

a light detector for detecting both a regular light beam having a wavelength longer than 190 nm and the vacuum ultraviolet light beam;

an optical unit including an achromatic lens system which is composed by combining one single lens produced from fluorite with another single lens produced from fluorine-doped synthetic quartz so as to fulfill achromatic conditions for both the regular light beam and the vacuum ultraviolet light beam; and a housing for enclosing said optical unit and said light detector in order to conduct one of (i) evacuating the inside of said housing and (ii) purging the inside of said housing by using nitrogen gas when measuring the vacuum ultraviolet light beam.

* * * * *